(12) United States Patent
Ishinaga

(10) Patent No.: US 6,608,334 B1
(45) Date of Patent: Aug. 19, 2003

(54) LIGHT-EMITTING CHIP DEVICE WITH CASE AND METHOD OF MANUFACTURE THEREOF

(75) Inventor: Hiroki Ishinaga, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/890,963
(22) PCT Filed: Dec. 4, 2000
(86) PCT No.: PCT/JP00/08590
§ 371 (c)(1), (2), (4) Date: Aug. 6, 2001
(87) PCT Pub. No.: WO01/43205
PCT Pub. Date: Jun. 14, 2001

(30) Foreign Application Priority Data

Dec. 9, 1999 (JP) .................................. 11-350058

(51) Int. Cl.[7] .......................... H01L 29/24; H01L 29/22
(52) U.S. Cl. .............................. 257/100; 257/99; 438/22
(58) Field of Search .......................... 257/88–89, 91, 257/98–100, 676; 438/22, 25–27, 29; 264/272.17

(56) References Cited

U.S. PATENT DOCUMENTS 4,862,586 A * 9/1989 Osada ........................ 29/827
5,492,586 A * 2/1996 Gorczyca .................... 156/245
6,274,890 B1 * 8/2001 Oshio et al. .................. 257/98

FOREIGN PATENT DOCUMENTS

| JP | 362025464 A | * 2/1987 | .......... H01L/31/02 |
| JP | 410261821 A | * 9/1998 | .......... H01L/33/00 |
| JP | 4011087740 A | * 3/1999 | .......... H01L/31/02 |

* cited by examiner

Primary Examiner—Nathan J. Flynn
Assistant Examiner—Johannes Mondt
(74) Attorney, Agent, or Firm—Gerald T. Bodner

(57) ABSTRACT

A chip-type light-emitting device (10) with case includes a chip (12), and the chip is die-bonded onto an electrode (16a) formed on a substrate (14). Furthermore, the light-emitting device includes a case (20) having holes (24a, 24b) at an approximately center of respective lower portions on first side surfaces of the case, and steps (26a, 26b) formed on respective upper edges of second side surfaces. A transparent resin for sealing the chip is filled from the holes to be filled in the case 2. At this time, the transparent resin is flowed from bottom to top in the case, and an air is discharged from an air vent which includes the steps.

6 Claims, 4 Drawing Sheets

LIGHT-EMITTING CHIP DEVICE WITH CASE AND METHOD OF MANUFACTURE THEREOF

TECHNICAL FIELD

The present invention relates to a chip-type light-emitting device with case and a method of manufacture thereof. More specifically, the present invention relates to a chip-type light-emitting device with case, in which a chip is bonded onto a substrate formed with electrodes, and a resin is filled as a sealant in a case having a rectangular shape in plane and covering the chip on the substrate, and a manufacturing method thereof.

PRIOR ART

Such a kind of a conventional chip-type light-emitting device 1 shown in FIG. 5(A) includes a substrate 2, and a semiconductor LED chip (hereinafter briefly referred to as a chip) 4 is die-bonded onto an electrode (lead) 3a formed on a surface of the substrate 2 by silver plate, for example. Furthermore, a bonding wire 5 is wire-bonded to connect a bonding pad 4a formed on an upper portion of the chip 4 to another lead 3b. In addition, in the chip-type light-emitting device 1, a transparent resin 6 is formed on a main surface (upper surface) of the substrate 2 so as to cover the chip 4. A hole 7 is formed at an approximately center of the transparent resin 6, and on a surface of the hole 7, a plating layer 8 is applied as understood from FIG. 5(B) which is a sectional view at a line P–P' shown in FIG. 5(A). Furthermore, a transparent resin 9 is filled in the hole 7 as a sealant, and the chip 4 is sealed. In such the chip-type light-emitting device 1, a number of manufacturing steps was reduced by injecting a resin by a transfer mold (opaque resin 6 and transparent resin 9).

However, in this prior art, as the transparent resin 9 was injected from above the hole 7 by the transfer mold, air bubbles might be contaminated in the transparent resin 9, i.e. the sealant, or there occurred the unfilling of the transparent resin 9. Therefore, in a case that the chip-type light-emitting device with case was automatically formed by merely applying the transfer mold, a similar problem was brought about.

SUMMARY OF THE INVENTION

Therefore, the primary object of the present invention is to provide a chip-type light-emitting device with case and a method of manufacture thereof, capable of stably forming a sealant even when formed by a transfer mold.

A chip-type light-emitting device with case, according to the present invention is a device in which a chip is bonded onto a substrate formed with electrodes on its surface, and a resin is filled as a sealant in a case having a rectangular shape in plane and covering the chip on the substrate, comprising: holes provided at lower portions on first opposite side surfaces of the case; and steps formed on upper edges of second side surfaces sandwiched by the first side surfaces.

A manufacture method for such a chip-type light-emitting device with case comprises steps of: (a) bonding a chip onto a substrate; (b) arranging a case on the substrate; and (c) forming a sealant by flowing a resin in the case.

Preferably, the step (a) includes a step (a1) bonding a plurality of chips onto a continuous substrate, and the step (b) includes a step (b1) arranging continuous case on the continuous substrate, and the step (c) includes a step (c1) forming a continuous sealant by filling the resin in the continuous case, and further comprising: (d) dicing a continuous body.

In this chip-type light-emitting device with case, the electrodes are formed on the substrate, and the chip is bonded onto the electrodes. Furthermore, the case having a rectangular shape in plane is provided to cover the chip, and a resin such as an epoxy resin, for example is filled in the case as the sealant. On the case, the holes are formed in lower portions of the first opposite side surfaces. In addition, on the upper edges of the second side surface, steps are provided. Therefore, when filling a resin, the sealant is injected from the holes (injection ports), and an air is discharged from exhaust vents (air vents) which includes the steps. Due to this, no air bubble is contaminated into the resin, and unfilling of the resin never occurs.

In other words, such the chip-type light-emitting device with case is formed by flowing a resin from bottom to top in the case.

For example, if a bonding wire connecting the chip and a lead is bonded in a direction along a flow of the resin intruded through the holes, it is possible to prevent the bonding wire from being damaged mechanically due to the injection of the resin for forming a sealant.

According to this present invention, it is possible to form a sealant stably even if formed by a transfer mold as no air bubble is contaminated in the resin and no resin is left unfilled.

The above described objects and other objects, features, aspects and advantages of the present invention will become more apparent from the following detailed description of the present invention when taken in conjunction with the accompanying drawings.

BEST FORM FOR PRACTICING THE INVENTION

Figure 1:
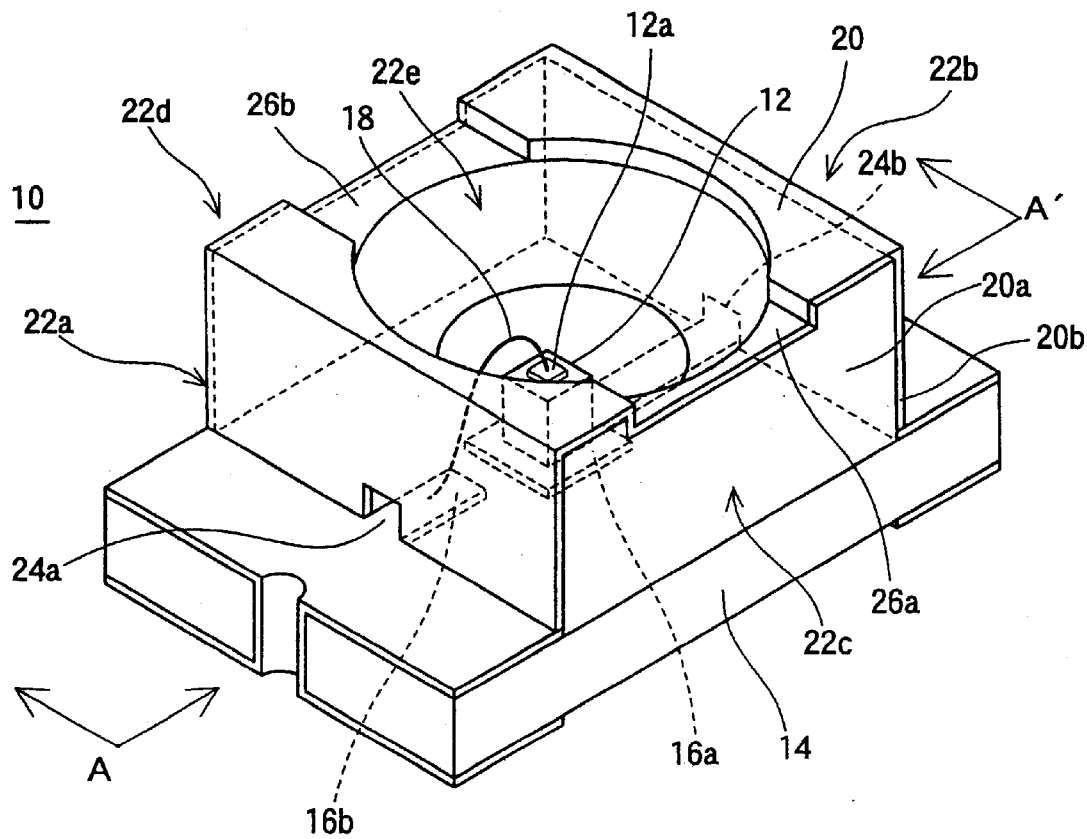
FIG. 1 is an illustrative view showing one embodiment of the present invention.

Referring to FIG. 1, a chip-type light-emitting device with case (hereinafter briefly referred to as light-emitting device) 10 of this embodiment includes a semiconductor light-emitting element (LED chip) 12, and the LED chip 12 is die-bonded onto an electrode (lead) 16a formed on a surface of a substrate 14 by silver paste, for example. Furthermore, a metal thin wire (bonding wire) 18 such as a gold wire is wire-bonded in order to connect a bonding pad 12a provided on the top of the LED chip 12 to another lead 16b. It is noted that in order to be easily understood, the leads 16a and 16b are represented by adding a thickness, in reality, however, they are formed in a thin film. In addition, the leads 16a ands 16b are patterned and formed by a lithography process and an etching process on the surface of the substrate 14.

Furthermore, the lead 16a and 16b are formed in such a manner as to extend from a one main surface (upper surface) of the substrate 14 to the other main surface (lower surface) via an approximately center portion (throughhole) of a side surface.

In addition, the light-emitting device 10 includes a case 20 having a rectangular shape in plane (hereinafter briefly referred to as a case), and the case 20 is disposed on the upper surface of the substrate 14 so as to cover the chip 12. The case 20 is formed by an opaque resin 20 on which a plating layer 20b of Ni (Nickel) and Cu (Copper) is applied. In addition, in the case 20, at approximately centers of respective lower portions of the first opposite side surfaces of the 22a and 22b, holes (injection ports) 24a and 24b are formed, and on upper edges of each of second opposite side surfaces 22c and 22d sandwiched by side surfaces 22a and 22b, steps 26a and 26b are formed. It is noted that the steps 26a and 26b are continuously formed up to a hollow 22e at a center of the case 20.

Figure 2:
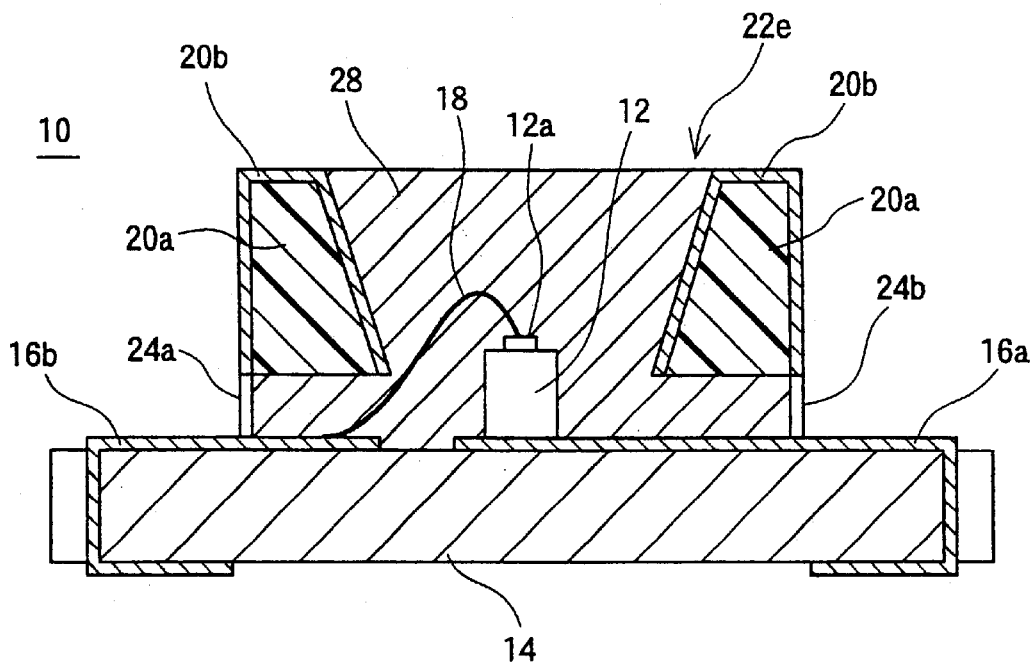
FIG. 2 is an illustrative view showing a sectional view of a chip-type light-emitting device with case shown in FIG. 1 embodiment.

In addition, as well understood by referring to FIG. 2 which is a sectional view at a line A—A' shown in FIG. 1, a transparent resin 28 such as an epoxy resin for protecting the chip 12 and the bonding wire 18 is filled in the hollow 22 of the case 20. In other words, the chip 12 is sealed by the transparent resin 28 as a sealant. It is noted that in FIG. 1, in order to show simply, the transparent resin 28 is omitted.

Furthermore, as understood from FIG. 2, a cross section of the hollow 22e is formed in a trapezoid-like shape. An oblique line between its upper base and lower base is inclined at such an angle so as to make an entire reflection of a light emitted from the chip 12. In other words, an inner surface of the hollow 22e is formed in a tapered shape, and the light-emitting device 10 can thus emit a light efficiently.

Figure 3:
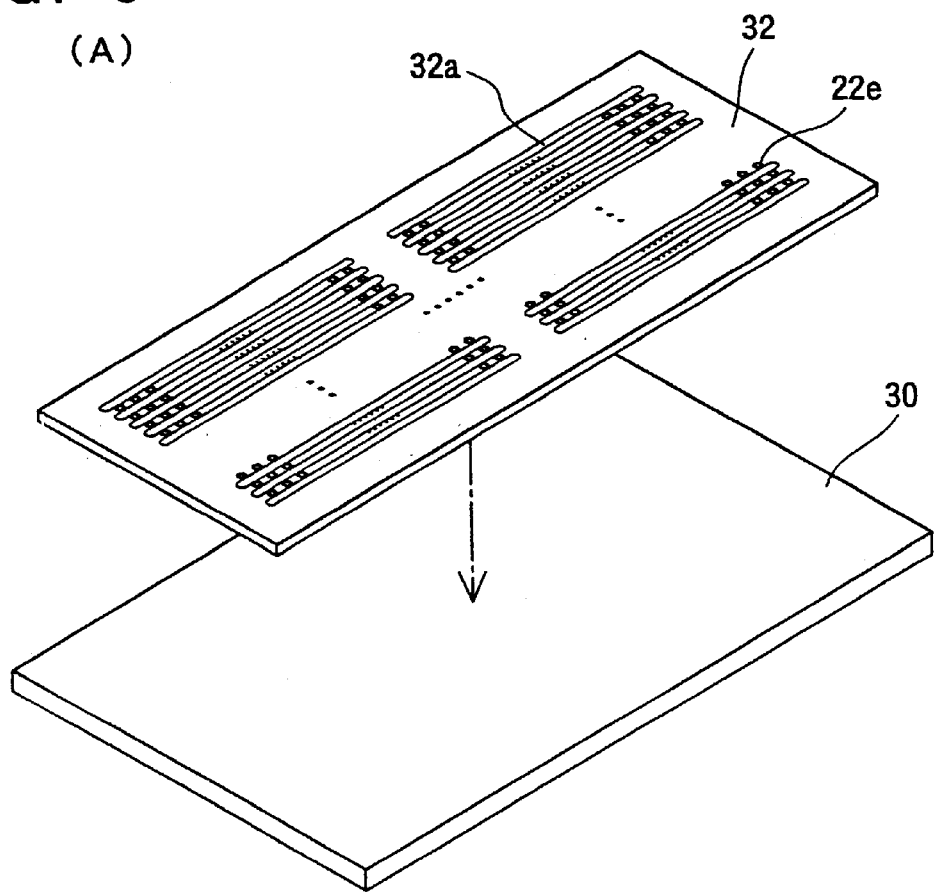
FIG. 3 is an illustrative view showing a manufacture process of forming a chip-type light-emitting device with case shown in FIG. 1 embodiment.
Figure 3:
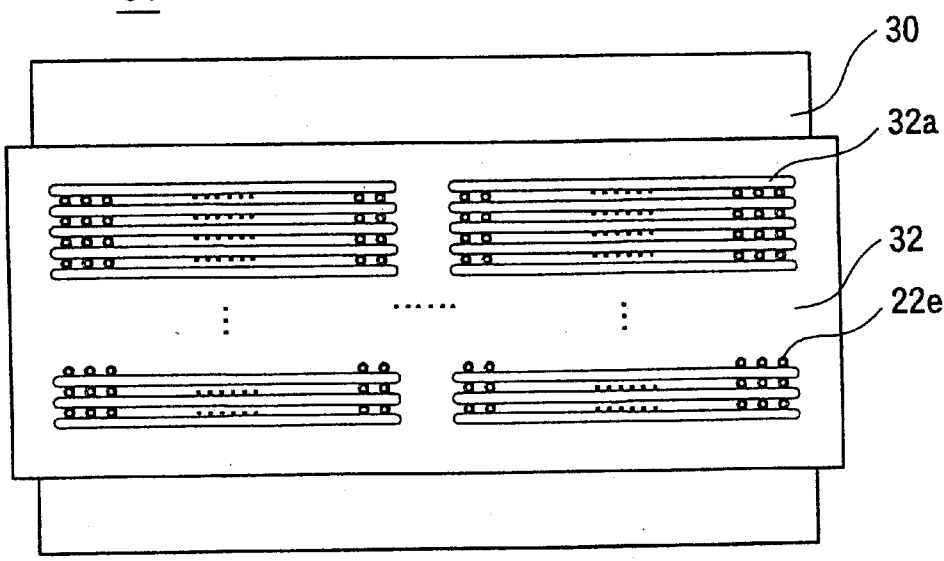

When forming such the light-emitting device 10, for example, as shown in FIG. 3(A), a continuous substrate 30 and a continuous case 32 are used to form a plurality of light-emitting devices 10. Although not shown, a plurality of sets of the leads 16a and 16b as described above are respectively formed continuously in longitudinal and lateral directions on a surface of the continuous substrate 30 according to the number of the light-emitting devices to be formed. Furthermore, in the continuous case 32, cases 20 are continuously formed according to the number of the light-emitting devices 10 to be formed. To describe in detail, in the continuous case 32, a plurality of long vents 32a is formed in such a manner as to be tangent to a plurality of hollows 22e formed continuously with predetermined intervals, and although not shown, the injection ports 24a and 24b as described above are formed on contact points of the hollows 22e and the long vent 32a. Furthermore, a plurality of steps 26a and 26b are formed in such a manner as to be parallel to the long vent 32a and to pass through approximately centers of the hollows 20e. Therefore, as understood from FIG. 4 which magnifies a part of FIG. 3, a groove 36 parallel with the long vent 32a is formed on the hollow 22e which is continuously disposed. It is noted that in FIG. 4 a part of a molded product 34 is shown, as understood from FIGS. 3(A) and 3(B), a portion shown in FIG. 4 is continued in the longitudinal and lateral directions, and the molded product 34 is then formed.

Returning to FIG. 3(A) in order to describe a specific method of manufacture (forming), at first, the chips 12 are die-bonded onto each of the plurality of leads 16a formed on the continuous substrate 30. Next, the bonding wires 18 are wire-bonded onto each of the bonding pads 12a and each of the plurality of the leads 16b. Consequently, as shown in FIG. 3(B), the continuous case 32 is mounted on the continuous substrate 30, and the case 32 is heated and then adhered.

The transparent resin 28 is injected by a transfer mold in the plurality of molded products 34 formed by the continuous substrate 30 and the continuous case 32 which are thus adhered. More specifically, in the molded product 34, a metal mold (not shown) which is formed in such a manner as to be brought into contact to an upper surface of the continuous case 32 is pressed down from above the continuous case 32, and the transparent resin 28 is then injected from one end of the long hole 32a. It is noted that the transparent resin 28 is turned into a tablet-like shape in advance, and injected by being pressurized by a plunger.

Figure 4:
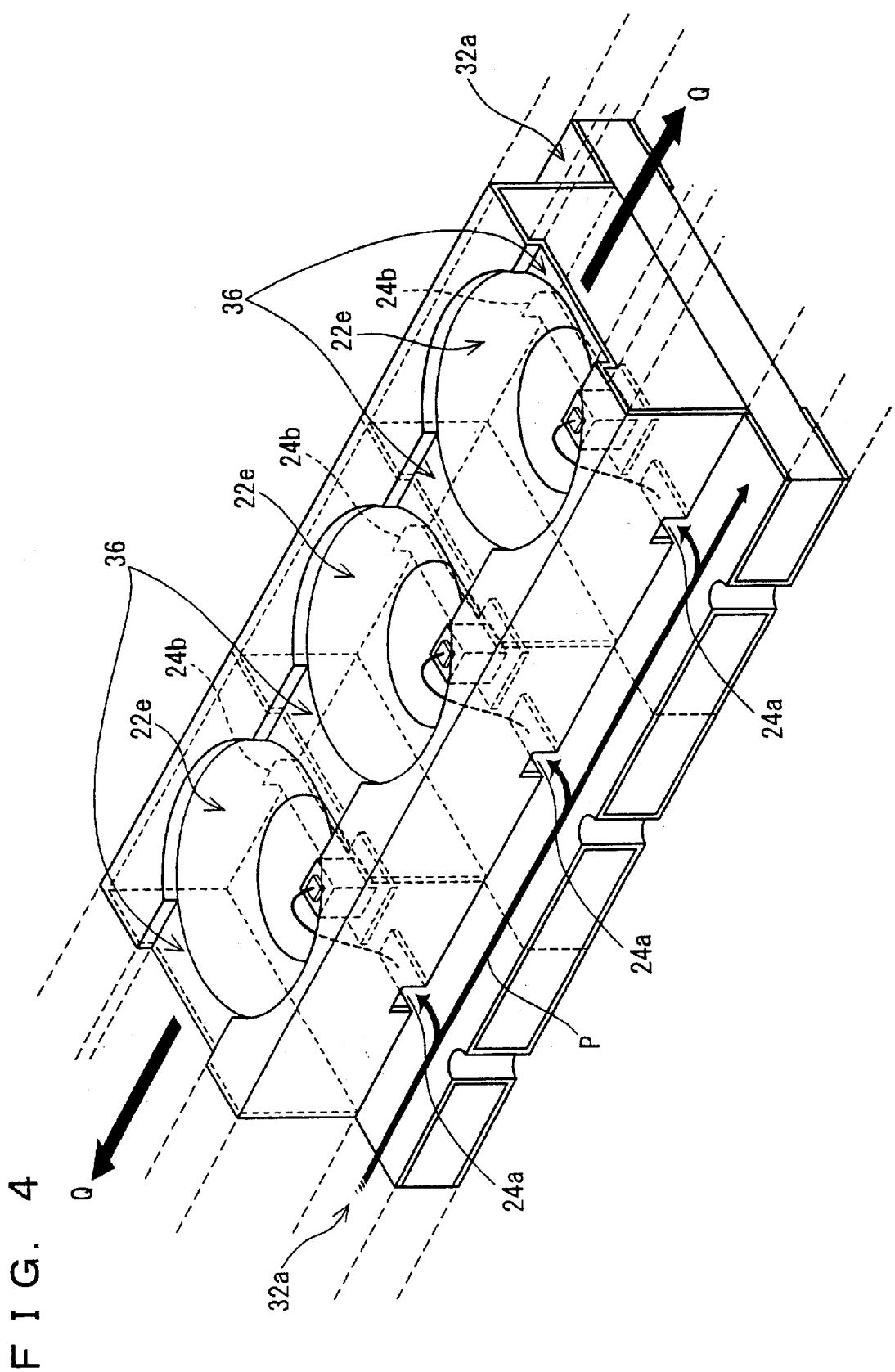
FIG. 4 is an illustrative view showing a manufacture process of forming a chip-type light-emitting device with case shown in FIG. 1 embodiment.
Figure 5:
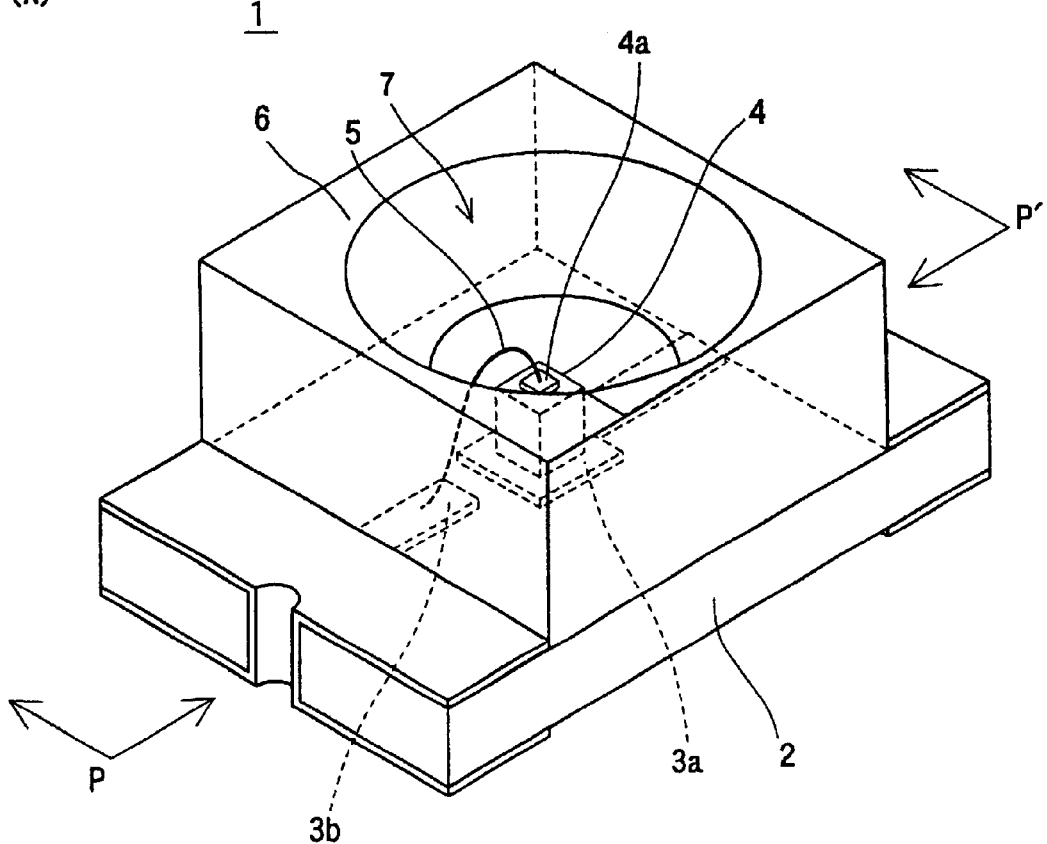
FIG. 5 is an illustrative view showing a conventional chip-type light-emitting device with case.
Figure 5:
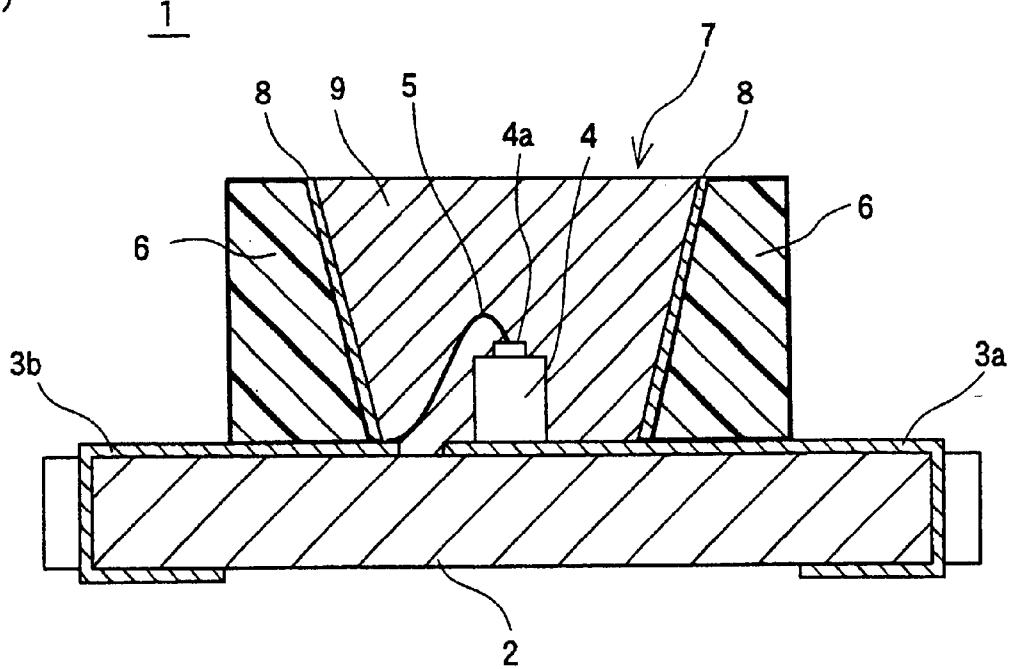

In other words, as understood from FIG. 4 showing a part of the molded product 34, the transparent resin 28 runs through an injection path P (a part of the long vent 32a), and is injected from the injection ports 24a and 24b provided on each of the light-emitting devices 10. It is noted that, for the convenience to illustrate in Figure, an injection path on a side of the injection ports 24b in FIG. 4 is omitted, the direction is, however, the same as the injection path P. Furthermore, since the bonding wires 18 are bonded in such a direction as to be along the flow of the transparent resin 28 intruded from the injection ports 24a and 24b, these bonding wires are not mechanically damaged by injecting the transparent resin 28.

The transparent resin 28 is thus injected from the injection ports 24a and 24b, that is, flowed from bottom to top in the case 20, and then the transparent resin 28 is filled in the cases 20. When the transparent resin 28 is thus injected, an air is discharged from exhaust vents (air vents) formed by the groove 36 and the metal mold through an exhaust path Q. Due to this, not only no air bubble is not contaminated in the transparent resin 28, but also no unfilling of the transparent resin 28 occurs. Furthermore, a surface of the transparent resin 28 becomes flat, enabling to collect a light outputted from the light-emitting device 10 in a desired direction.

When the transparent resin 28 is cured by heat, namely, when the chip 12 is sealed, in the following step the molded product 34 is subjected to a dicing, and then a plurality of discrete light-emitting devices 10 is obtained. Subsequently, the transparent resin 28 is injected in the subsequent molded product 34. Thereafter, the same processes described above are carried out to each of the molded products 34.

According to this embodiment, since the transparent resin is flowed from bottom to top in the case by the transfer mold, and the air is discharged from the exhaust vents, the air bubble is not contaminated in the transparent resin, and unfilling of the transparent resin does not occur. As a result, even if formed by the transfer mold, the sealant can be stably formed. It thus enables to increase the yield.

It is noted that in this embodiment, only a method of manufacture for a chip-type light-emitting device with case was described. However, such a method of manufacture is also applicable to a chip-type sensor and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A chip-type light-emitting device with case, in which said case has an outer periphery including two first side surfaces opposite to each other and two second side surfaces sandwiched by said first side surfaces and an inner periphery defining a hollow portion wherein a chip is bonded onto a substrate formed with electrodes, and a resin is filled as a sealant in said hollow portion so as to cover said chip on said substrate, comprising:

holes formed at lower portions on first opposite side surfaces of said case, said holes communicating said outer periphery to said hollow portion such that said resin can be injected into said hollow portion via said holes; and steps formed on upper edges of said second side surfaces, said steps communicating said outer periphery to said hollow portion such that in injecting said resin into said hollow portion an air can be discharged from said hollow portion via said steps.

2. A chip-type light-emitting device with case according to claim 1, further comprising a bonding wire connecting said chip and said electrodes, wherein said bonding wire is bonded in a direction along a flow of said resin intruded from said holes.

3. A method of manufacture for a chip-type light-emitting device with case, comprising steps of:

(a) preparing a case having an outer periphery including two first side surfaces opposite to each other and two second side surfaces sandwiched by said first side surfaces and an inner periphery defining a hollow portion, holes being formed at lower portions of said first side surfaces and steps being formed on upper edges of said second side surfaces;

(b) bonding a chip onto a substrate;

(c) arranging said case on said substrate in a manner that said chip bonded onto said substrate is positioned within said hollow portion of said case; and (d) injecting a resin from said holes into said hollow portion to form a sealant which covers said chip while discharging air from said steps, said holes communicating said outer periphery to said hollow portion such that said resin can be injected into said hollow portion via said holes, said steps communicating said outer periphery to said hollow portion such that in injecting said resin into said hollow portion an air can be discharged via said steps.

4. A method according to claim 3, wherein, said step (a) includes a step (a1) bonding a plurality of chips onto a successive substrate, said step (b) includes a step (b1) arranging a continuous case on said successive substrate, and said step (c) includes a step (c1) forming a continuous sealant by filling said resin in said continuous case, and further comprising a step of:

(a) dicing a continuous body.

5. A method according to claim 3, wherein in said step (c), the bonding wire is bonded in a direction along a flow of the resin intruded from the holes in said case.

6. A method according to claim 4, wherein in said step (c), the bonding wire is bonded in a direction along a flow of the resin intruded from the holes in said case.

* * * * *